United States Patent

Patton et al.

(10) Patent No.: US 6,660,928 B1
(45) Date of Patent: Dec. 9, 2003

(54) MULTI-JUNCTION PHOTOVOLTAIC CELL

(75) Inventors: Martin O. Patton, Fairview Park, OH (US); Samar Sinharoy, Monroeville, PA (US); Victor G. Weizer, Cleveland Heights, OH (US)

(73) Assignee: Essential Research, Inc., Cleveland, OH (US)

( * ) Notice: Subject to any disclaimer, the term of this patent is extended or adjusted under 35 U.S.C. 154(b) by 0 days.

(21) Appl. No.: 10/114,369

(22) Filed: Apr. 2, 2002

(51) Int. Cl.[7] .......................... H01L 31/06; H01L 31/04
(52) U.S. Cl. ...................... 136/249; 136/255; 136/252; 136/262; 136/261; 257/461; 257/464; 257/431
(58) Field of Search ................. 136/249, 255, 136/252, 262, 261; 257/461, 464, 431

(56) References Cited

U.S. PATENT DOCUMENTS

| | | | |
|---|---|---|---|
| 5,019,177 A | 5/1991 | Wanlass | 136/249 |
| 5,407,491 A | 4/1995 | Freundlich et al. | 136/249 |
| 5,508,206 A | 4/1996 | Glenn et al. | 438/68 |
| 5,539,562 A | 7/1996 | Morioka et al. | 359/159 |
| 5,548,140 A | 8/1996 | Nguyen et al. | 257/194 |
| 5,571,339 A | 11/1996 | Ringel et al. | 136/252 |
| 5,580,395 A | 12/1996 | Yoshioka et al. | 136/255 |
| 5,738,732 A | 4/1998 | Nakamura et al. | 136/255 |
| 5,753,050 A | 5/1998 | Charache et al. | 136/255 |
| 5,763,118 A | 6/1998 | Stafford et al. | 429/163 |
| 5,853,497 A * | 12/1998 | Lillington et al. | 136/249 |
| 5,902,417 A | 5/1999 | Lillington et al. | 136/246 |
| 6,034,321 A | 3/2000 | Jenkins | 136/252 |
| 6,043,425 A | 3/2000 | Assad | 136/246 |
| 6,057,506 A | 5/2000 | Charache et al. | 136/253 |
| 6,103,970 A | 8/2000 | Kilmer et al. | 136/252 |
| H1856 H | 9/2000 | Baldasaro et al. | 136/258 |
| 6,127,623 A | 10/2000 | Nakamura et al. | 136/256 |
| 6,147,296 A | 11/2000 | Freundlich | 136/255 |
| 6,150,602 A | 11/2000 | Campbell | 136/244 |
| 6,150,603 A | 11/2000 | Karam et al. | 136/252 |
| 6,150,604 A | 11/2000 | Freundlich et al. | 136/253 |
| 6,166,318 A | 12/2000 | Freeouf | 136/249 |
| 6,180,432 B1 | 1/2001 | Freeouf | 438/93 |
| 6,184,056 B1 | 2/2001 | Nakamura et al. | 438/57 |
| 6,188,012 B1 | 2/2001 | Ralph | 136/246 |
| 6,229,084 B1 | 5/2001 | Katsu | 136/255 |
| 6,243,243 B1 | 6/2001 | Gelderloos et al. | 361/56 |
| 6,255,580 B1 | 7/2001 | Karam et al. | 136/256 |
| 6,281,426 B1 * | 8/2001 | Olson et al. | 136/249 |
| 6,300,557 B1 | 10/2001 | Wanlass | 136/255 |
| 6,313,396 B1 | 11/2001 | Glenn | 136/244 |
| 6,316,715 B1 | 11/2001 | King et al. | 136/255 |
| 6,340,788 B1 * | 1/2002 | King et al. | 136/261 |
| 6,437,233 B1 * | 8/2002 | Tran et al. | 136/249 |
| 2001/0018924 A1 * | 9/2001 | Hisamatsu et al. | 136/249 |
| 2002/0040727 A1 * | 4/2002 | Stan et al. | 136/255 |
| 2002/0195137 A1 * | 12/2002 | King et al. | 136/249 |

FOREIGN PATENT DOCUMENTS

| | | |
|---|---|---|
| WO | 00/24024 | 4/2000 |
| WO | 00/24064 | 4/2000 |
| WO | 00/30178 | 5/2000 |
| WO | 01/07691 | 2/2001 |

OTHER PUBLICATIONS

"Solar Cells for NASA Rainbow Concentrator" by Smith et al., IEEE Publication, pp. 1139–1141 (2000).

"1.62eV/1.1 eV InGaP/InGaAs Dual–Junction Solar Cell Development on Lattice–Mismatched GaAs" by Sinharoy et al., IEEE Publication, pp. 1285–1288 (2000).

* cited by examiner

*Primary Examiner*—Alan Diamond
(74) *Attorney, Agent, or Firm*—Renner, Kenner, Greive, Bobak, Taylor & Weber (57) ABSTRACT

A solar cell comprising a substrate, a buffer layer, a first subcell, a second subcell, and a third subcell, where said first subcell, said second subcell, and said third subcell are lattice matched, and where said substrate is lattice mismatched with said first, second, and third subcells.

23 Claims, 2 Drawing Sheets

MULTI-JUNCTION PHOTOVOLTAIC CELL

The United States government may have certain rights to this technology under Grant No. AFRL/USSV F29601-99-C-0135.

TECHNICAL FIELD

This invention relates to multi-junction photovoltaic cells that are particularly useful in non-terrestrial applications.

BACKGROUND OF THE INVENTION

Photovoltaic cells, which are devices that convert light energy into electrical energy, are known. Where the cells are employed in non-terrestrial applications, e.g., satellites, the efficiency of the cell is of paramount importance because the cost of delivering objects into orbit is directly related to the payload weight. In other words, the number of cells required to power any given satellite can be decreased if the efficiency of the photovoltaic cell used to power the satellite is increased. This reduction in the number of cells employed directly translates into a decreased payload weight, which makes the deployment of the satellite or other non-terrestrial device more efficient.

A known technique for increasing cell efficiency includes constructing a multi-junction cell. Each cell within a multi-junction cell can convert light energy of a different wavelength and thereby attempt to maximize the available solar spectrum. The construction of multi-junctions cells, however, offers many challenges, especially where the cell is constructed by using epitaxial methods. To begin with, efficiency of a multi-junction cell depends on the ability to provide a single crystal lattice that is substantially free of defects; i.e., the cell should be monolithic. Defects in the lattice structure of the cell cause loss of useful minority carriers through recombination and absorption. Also, the selection of an appropriate lattice constant and band gap of the epitaxial layers constituting the cell directly impacts cell efficiency. Further, the cell should be constructed to maximize current flow through each subcell. And, the individual subcells must not only be lattice matched with each other, but they should be individually engineered at an appropriate band gap to maximize absorption.

While various cell structures have been made, a triple-junction cell having a theoretical efficiency of about 31% at airmass zero one-sun condition (AM0 1-sun) and a practical efficiency of about 27% (AM0 1-sun) is believed to be the most efficient cell that has been constructed in the prior art. This cell includes a 1.85 eV InGaP top cell, a 1.43 eV GaAs middle cell, and a 0.67 eV Ge bottom cell, where each cell is constructed at lattice constant of 5.65 Å.

Because efficient deployment of non-terrestrial devices, such as satellites, is becoming increasingly desirous, there is a need to provide a photovoltaic cell for use in non-terrestrial devices that has even greater efficiency than those proposed. Even the smallest incremental increase in efficiency can translate into tremendous efficiency in the overall deployment of the non-terrestrial device.

SUMMARY OF INVENTION

In general the present invention provides a triple-junction photovoltaic device comprising a p-doped substrate comprising GaAs, a p-doped buffer layer deposited on said substrate, where said buffer layer comprises $In_{0.13}Ga_{0.87}As$, a bottom subcell deposited on said buffer layer, where said bottom subcell includes a p-doped back window layer comprising $In_{0.62}Ga_{0.38}P$, a p-doped base layer deposited on said back window layer and comprising $In_{0.13}Ga_{0.87}As$, an n-doped emitter layer deposited on said base layer and comprising $In_{0.13}Ga_{0.87}As$, and a n-doped front window layer comprising $In_{0.62}Ga_{0.38}P$, a lower tunnel junction deposited on said bottom subcell, where said lower tunnel junction includes an n-doped lower layer comprising $In_{0.62}Ga_{0.38}P$, and a p-doped upper layer comprising $Al_{0.09}Ga_{0.91}As$, a middle subcell deposited on the upper surface of said lower tunnel junction, where said middle subcell includes a p-doped back window layer comprising $In_{0.62}Ga_{0.38}P$, a p-doped base layer deposited on said back window layer and comprising $In_{0.49}Ga_{0.51}As_{0.23}P_{0.77}$, an n-doped emitter layer deposited on said base layer and comprising $In_{0.49}Ga_{0.51}As_{0.23}P_{0.77}$, and a n-doped front window layer comprising $Al_{0.42}In_{0.58}P$, a upper tunnel junction deposited on said middle subcell, where said upper tunnel junction includes an n-doped lower layer comprising $In_{0.62}Ga_{0.38}P$, and a p-doped upper layer comprising $Al_{0.09}Ga_{0.91}As$, a top subcell deposited on the upper surface of said upper tunnel junction, where said top subcell includes a p-doped back window layer comprising $Al_{0.42}In_{0.58}P$, a p-doped base layer deposited on said back window layer and comprising $(In)_{0.6}(Ga_{0.33}Al_{0.67})_{0.4}P$, an n-doped emitter layer deposited on said base layer and comprising $(In)_{0.6}(Ga_{0.33}Al_{0.67})_{0.4}P$, and a n-doped front window layer comprising $Al_{0.42}In_{0.58}P$, and an n-doped cap layer deposited on said top subcell and comprising $In_{0.13}Ga_{0.87}As$.

The present invention also includes a solar cell comprising a first subcell, where the first subcell includes a doped base layer and an emitter layer that is oppositely doped from the first base layer, and where the subcell comprises InGaAs, a second subcell, where the second subcell includes a doped base layer and an emitter layer that is oppositely doped from the base layer, and where the second subcell comprises InGaAsP, a third subcell, where the third subcell includes a doped third base layer and an emitter layer that is oppositely doped from the third base layer, and where the third subcell comprises AlGaInP, where said first subcell, said second subcell, and said third subcell are lattice matched.

The present invention further includes a multi-junction photovoltaic device comprising a bottom subcell, where said bottom subcell includes a p-doped base layer comprising germanium, and an n-doped emitter layer comprising germanium, a bottom window layer deposited on said bottom subcell, where said bottom window layer comprises GaAs, a p-doped buffer layer deposited on said bottom window layer, where said buffer layer comprises $In_{0.13}Ga_{0.87}As$, a lower tunnel junction deposited on said buffer layer, where said lower tunnel junction includes a degenerately n-doped lower layer comprising $In_{0.13}Ga_{0.87}As$, and a degenerately p-doped upper layer comprising $In_{0.13}Ga_{0.87}As$, a lower-middle subcell deposited on the upper surface of said lower tunnel junction, where said lower middle subcell includes a p-doped back window layer comprising $In_{0.62}Ga_{0.38}P$, a p-doped base layer deposited on said back window layer and comprising $In_{0.13}Ga_{0.87}As$, an n-doped emitter layer deposited on said base layer and comprising $In_{0.13}Ga_{0.87}As$, and a n-doped front window layer comprising $In_{0.62}Ga_{0.38}P$, a middle tunnel junction deposited on said lower middle subcell, where said middle tunnel junction includes an n-doped lower layer comprising $In_{0.62}Ga_{0.38}P$, and a p-doped upper layer comprising $Al_{0.09}Ga_{0.91}As$, an upper-middle subcell deposited on the middle tunnel junction, where said upper-middle subcell includes a p-doped back window layer comprising $In_{0.62}Ga_{0.38}P$, a p-doped base layer deposited on said back window layer and comprising $In_{0.49}Ga_{0.51}As_{0.23}P_{0.77}$, an n-doped emitter layer deposited on said base layer and comprising $In_{0.49}Ga_{0.51}As_{0.23}P_{0.77}$, and a n-doped front window layer comprising $Al_{0.42}In_{0.58}P$, an upper tunnel junction deposited on said upper-middle subcell, where said upper tunnel junction includes an n-doped lower layer comprising $In_{0.62}Ga_{0.38}P$, and a p-doped upper layer comprising $Al_{0.09}Ga_{0.91}As$, a top subcell deposited on the upper tunnel junction, where said top subcell includes a p-doped back window layer comprising $Al_{0.42}In_{0.58}P$, a p-doped base layer deposited on said back window layer and comprising $(In)_{0.6}(Ga_{0.33}Al_{0.67})_{0.4}P$, an n-doped emitter layer deposited on said base layer and comprising $(In)_{0.6}(Ga_{0.33}Al_{0.67})_{0.4}P$, and a n-doped front window layer comprising $Al_{0.42}In_{0.58}P$, and an n-doped cap layer deposited on the top subcell and comprising $In_{0.13}Ga_{0.87}As$.

The photovoltaic cells of the present invention advantageously provide improvements over the prior art photovoltaic cells in overall cell efficiency and power density. Also, the cells of this invention exhibit useful radiation hardness. As a result, the cells of this invention are particularly useful in non-terrestrial applications because they can provide overall efficiency in the deployment of non-terrestrial devices that employ the cells as an energy source. In one embodiment of this invention, a triple-junction photovoltaic cell provides a theoretical efficiency of about 36% (AM0 1-sun) and a practical efficiency of about 31% (AM0 1-sun). In another embodiment, a quad-junction photovoltaic cell provides a theoretical efficiency of about 40% (AM0 1-sun) and a practical efficiency of about 34% (AM0 1-sun). Also, the cells of this invention can advantageously be current matched by selecting an appropriate thickness for each of the various subcells.

PREFERRED EMBODIMENT FOR CARRYING OUT THE INVENTION

The photovoltaic cells of this invention are multi-junction cells that include at least three subcells that are lattice matched at 5.65 Å to 5.75 Å. The term lattice matched refers to the fact that each subcell is constructed to have the same lattice constant within about 5%, i.e., 0.050 Å. In one embodiment, the photovoltaic cell includes three subcells, i.e., a triple-junction cell, and in a second embodiment, the cell includes four subcells, i.e., a quad-junction cell.

The triple-junction photovoltaic cell includes three subcells that are lattice matched at a lattice constant of 5.65 Å to 5.75 Å, preferably 5.67 Å to 5.73 Å, and more preferably 5.70 Å. The cell is preferably constructed on a substrate that is characterized by being hard or robust. The substrate, however, need not be lattice matched to the subcells because a buffer layer is provided between the substrate and the first subcell. Between each subcell is a tunnel junction. The tunnel junction is preferably degenerately doped, preferably non-absorbing to light energy intended for lower subcells, and need not be exactly lattice matched to the subcells. Each subcell also preferably includes a front and a back window layer. A cap layer, anti-reflective coating, and appropriate contacts, which are generally known in the art, are also included within the solar cell.

Each subcell within the triple-junction solar cell includes a base layer and an emitter layer. Also, each subcell preferably includes a front and back window. The base layer, emitter layer, front window, and back window are lattice matched. Also, the base layer and the emitter layer are engineered to have the same energy gap. The front and back windows should have a higher band gap than the active p/n junction layers of the cells. The base layer and the emitter layer are oppositely doped. In other words, if the base layer is p-doped, the emitter layer is n-doped, and if the base layer is n-doped, then the emitter layer is p-doped.

The first subcell, which in this first embodiment may be referred to as the bottom cell, is engineered to have an energy gap of about 1.1 to about 1.4 eV. Preferably, the first subcell is engineered to have a an energy gap of 1.2 to about 1.3 eV, and more preferably an energy gap of 1.2 eV. The preferred material for constructing this subcell is indium gallium arsenide, e.g., $In_{0.13}Ga_{0.87}As$.

The second subcell, which in this first embodiment may be referred to as the middle cell, is engineered to have an energy gap of 1.4 to 1.8 eV. Preferably, the second subcell is engineered to have an energy gap of 1.5 to about 1.7 eV, and more preferably an energy gap of 1.6 eV. The preferred material for constructing this subcell is indium gallium arsenide phosphide, e.g., $In_{0.49}Ga_{0.51}As_{0.23}P_{0.77}$.

The third subcell, which in this first embodiment may be referred to as the top cell, is engineered to have an energy gap of 1.9 to about 2.3 eV. Preferably, the third subcell is engineered to have an energy gap of 2.0 to about 2.2 eV, and more preferably an energy gap of 2.1 eV. The preferred material for constructing this subcell is indium gallium aluminum phosphide, e.g. $(In)_{0.6}(Ga_{0.33}Al_{0.67})_{0.4}P$.

Figure 1:
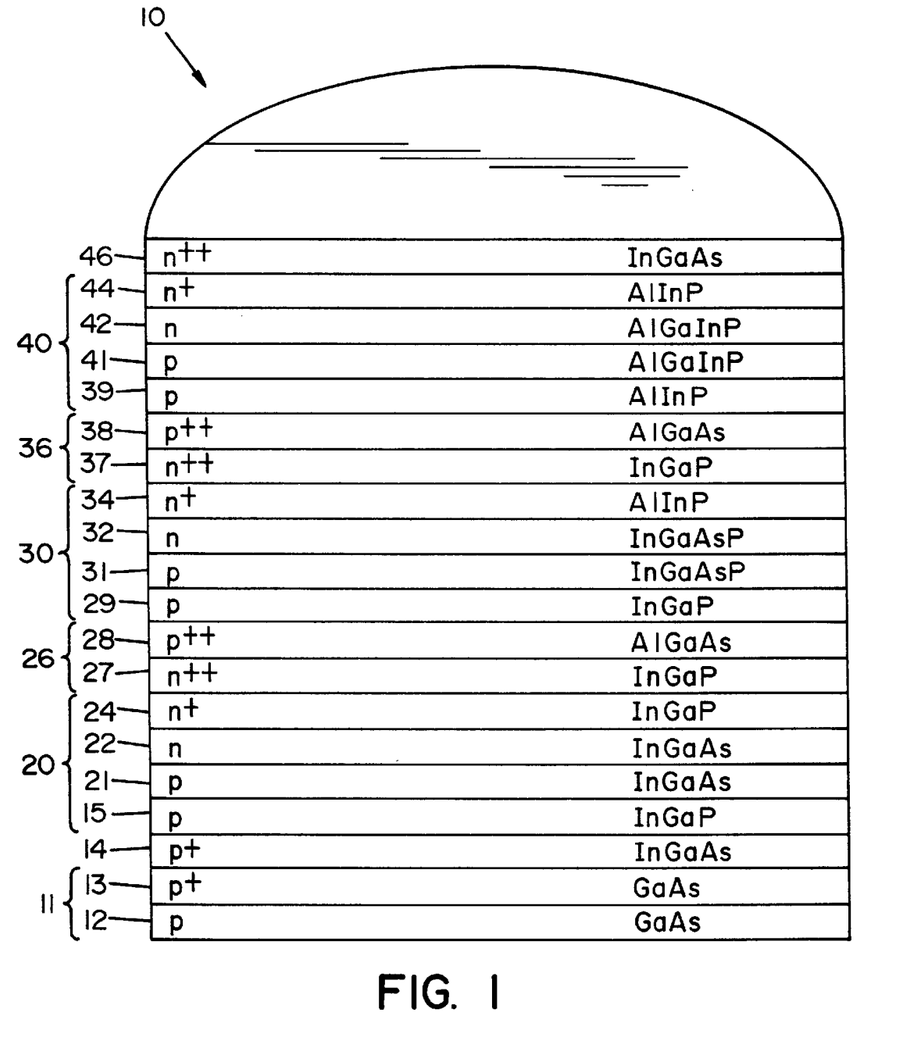
FIG. 1 is a sketch of a triple-junction solar cell according to the preferred embodiment of this invention, although it is noted that the various layers of the cell are not drawn to scale, and as those skilled in the art will appreciate the cell is not completed inasmuch as the contacts and MESA isolation are not shown.

The preferred triple-junction solar cell of the present invention can be described with reference to FIG. 1. The solar cell 10 is constructed on a substrate 11. The preferred substrate includes a wafer 12 of gallium arsenide (GaAs). While the thickness of the wafer can be varied depending on the intended application requirements, a thickness of about 300 to about 400 µm is preferred.

In one embodiment, substrate 11 is modified by growing a GaAs epitaxial layer 13 on wafer 12. Preferably, epitaxial layer 13 is grown to a thickness of about 0.1 to about 0.3 µm, and more preferably about 0.2 µm. This epitaxial layer is optional inasmuch as it may be desirable to decrease the thickness of the layer by polishing or the like. The GaAs epitaxial layer 13 preferably has a lattice constant of 5.65 Å. The GaAs wafer 12 is preferably p-doped with zinc at a concentration of about 4.0 to about 8.0 E 18/cm$^3$, and the GaAs epitaxial layer 13 is preferably p-doped at a concentration of about 2.0 to about 4.0 E 18/cm$^3$.

A buffer layer 14 is grown on top of substrate 11. The buffer layer can be monolithic or graded, and the top surface of buffer layer 14 is preferably lattice matched to the first subcell, i.e., 5.65 to about 5.75 Å, and preferably 5.7 Å. Buffer layer 14 has a thickness from about 1.0 to about 2.0 µm, and preferably about 1.5 µm. Buffer layer 14 is preferably p-doped with zinc at a concentration of about 2.0 to about 4.0 E 18/cm$^3$. The preferred material for growing buffer crystal 14 is indium gallium arsenide, e.g., $In_{0.13}Ga_{0.87}As$. It has been found that a monolithic buffer layer can be effectively employed so long as the buffer layer is buffering a subcell configuration that is lattice matched to 5.7 Å. Where the lattice constant of the subcell configuration is greater than 5.7 Å, e.g., 5.73 Å, a graded buffer layer is preferred. For example, one may employ a graded buffer of InGaAs that has lower layers that include about 13% indium and that progress to about 20% indium at or near the top of the buffer layer.

A bottom or first subcell 20 is grown on buffer layer 14. The preferred bottom subcell includes a back window layer 15, a base layer 21, an emitter layer 22, and a front window 24. Each layer within bottom subcell 20 is lattice matched to 5.65 to about 5.75 Å, and preferably 5.7 Å.

Back window layer 15 preferably has a thickness of about 0.03 to about 0.06 μm, and is p-doped with zinc at a concentration of about 5.0 to about 8.0 E 17/cm$^3$. Back window layer 15 is engineered to have an energy gap of 1.61 to 1.63 eV, and preferably 1.62 eV, which is preferably accomplished by growing an indium gallium phosphide epitaxial layer, e.g., $In_{0.62}Ga_{0.38}P$.

Base layer 21 is grown on top of back window layer 15, and emitter layer 22 is grown on top of base layer 21. The thickness of base layer 21 is from about 2.5 to about 3.5 μm, and the thickness of emitter layer 22 is from about 0.4 to about 0.6 μm. The active layers of bottom subcell 20, i.e., layers 21 and 22, are engineered to have an energy gap of 1.1 to 1.4 eV, and preferably 1.2 eV. This is preferably accomplished by growing an indium gallium arsenide epitaxial layer, e.g., $In_{0.13}Ga_{0.87}As$. Base layer 21 is p-doped with zinc at a concentration of about 1.0 to about 3.0 E 17/cm$^3$, and the emitter layer is n-doped with silicon at a concentration of about 2.0 to about 6.0 E 18/cm$^3$.

Front window layer 24 is grown on emitter layer 22 and has a thickness of about 0.03 to about 0.06 μm, and is n-doped with silicon at a concentration of about 5.0 to about 9.0 E 18/cm$^3$. Window layer 24 is engineered to have an energy gap of 1.5 to 1.7 eV, and preferably 1.6 eV, which is preferably accomplished by growing an indium gallium phosphide epitaxial layer, e.g., $In_{0.62}Ga_{0.38}P$.

A first tunnel junction 26 is grown on top of window layer 24. Tunnel junction 26 includes a lower layer 27, which is degenerately n-doped with silicon at a concentration above about 1.0 E 19/cm$^3$, and a upper layer 28, which is degenerately p-doped with zinc at a concentration above about 8.0 E 18/cm$^3$. Lower level 27 is engineered to have an energy gap of 1.61 to 1.63 eV, and preferably 1.62 eV, which is preferably accomplished by growing an indium gallium phosphide epitaxial layer, e.g. $In_{0.62}Ga_{0.38}P$. Upper layer 28 is engineered to have an energy gap of 1.53 to 1.9 eV, preferably 1.54 to 1.65 eV, and more preferably 1.55 eV, which is preferably accomplished by growing an aluminum gallium arsenide epitaxial layer. The specific composition of the aluminum gallium arsenide can be defined by $Al_xGa_yAs$, where x is 0.09 to 0.4 and y is 0.91 to 0.6. The preferred composition is $Al_{0.09}Ga_{0.91}As$. Lower layer 27 has a thickness from about 0.02 to about 0.03 μm, and upper layer 28 has a thickness of about 0.02 to about 0.03 μm. While it is preferred that both upper layer 28 and lower layer 27 are lattice matched, these layers may be mismatched within about 10%, i.e., 0.1 Å, with respect to the subcells since both upper layer 28 and lower layer 27 are very thin. It is believed that subsequent subcells can be pseudomorphically grown on the mismatched tunnel junction.

A second or middle subcell 30 is grown on first tunnel junction 26. The preferred middle subcell includes a back window layer 29, a base layer 31, an emitter layer 32, and a front window 34. Each layer within middle subcell 30 is lattice matched to 5.65 to about 5.75 Å, and preferably 5.7 Å.

Back window 29 has a thickness of about 0.03 to about 0.06 μm, and is engineered to have an energy gap of 1.61 to 1.63 eV, and preferably about 1.62 eV, which is preferably accomplished by growing an indium gallium phosphide epitaxial layer, e.g. $In_{0.62}Ga_{0.38}P$.

Base layer 31 is grown on back window layer 29, and emitter layer 32 is grown on base layer 31. Base layer 31, which is p-doped with zinc at a concentration of about 1.0 to about 3.5 E 17/cm$^3$, has a thickness of about 0.4 to about 1.0 μm. Emitter layer 32, which is n-doped with silicon at a concentration of about 4.0 to about 9.0 E 18/cm$^3$, has a thickness from about 0.3 to about 0.6 μm. The active layers of middle subcell 30, i.e., layers 31 and 32, are engineered to have an energy gap of 1.5 to 1.7 eV, and preferably 1.6 eV, which is preferably accomplished by growing an indium gallium arsenide phosphide epitaxial layer, e.g., $In_{0.49}Ga_{0.51}As_{0.23}P_{0.77}$.

Front window layer 34 is grown on emitter layer 32 and has a thickness of about 0.03 to about 0.05 μm. Front window layer 34 is n-doped with silicon at a concentration of about 0.8 to about 1.0 E 19/cm$^3$. Window layer 34 is engineered to have an energy gap of 2.2 to 2.4 eV, and preferably 2.3 eV, which is preferably accomplished by growing an aluminum indium phosphide epitaxial layer, e.g., $Al_{0.42}In_{0.58}P$.

A second tunnel junction 36 is grown on window layer 34. Tunnel junction 36 includes a lower layer 37, which is degenerately n-doped with silicon at a concentration above about 1.0 E 19/cm$^3$, and a upper layer 38, which is degenerately p-doped with zinc at a concentration above about 8.0 E 18/cm$^3$. Lower level 37 is engineered to have an energy gap of 1.61 to 1.63 eV, and preferably 1.62 eV, which is preferably accomplished by growing an indium gallium phosphide epitaxial layer, e.g., $In_{0.62}Ga_{0.38}P$. Upper layer 38 is engineered to have an energy gap of 1.53 to 1.56 eV, preferably 1.54 to 1.65 eV, and more preferably 1.55 eV, which is preferably accomplished by growing an aluminum gallium arsenide epitaxial layer. The specific composition of the aluminum gallium arsenide can be defined by $Al_xGa_yAs$, where x is 0.09 to 0.4 and y is 0.91 to 0.6. The preferred composition is $Al_{0.09}Ga_{0.91}As$. Lower layer 37 has a thickness from about 0.02 to about 0.03 μm, and upper layer 38 has a thickness of about 0.02 to about 0.03 μm. While it may be preferred to lattice match the tunnel junction layers to the monolithic cell, tunnel junction layers 37 and 38 may be mismatched within about 10% with respect to the subcells. As with the first tunnel junction, the fact that the tunnel junction is very thin allows it to be lattice mismatched.

A third or top subcell 40 is grown on second tunnel junction 36. The preferred top subcell includes a back window layer 39, a base layer 41, an emitter layer 42, and a front window 44. Each layer within top subcell 40 is lattice matched to 5.65 to 5.75 Å, and preferably 5.7 Å.

Back window layer 39 preferably has a thickness of about 0.03 to about 0.05 μm, is preferably p-doped with zinc at a concentration of about 1.0 to about 8.0 E 18/cm$^3$, and is engineered to have an energy gap of 2.2 to 2.4 eV, and preferably 2.3 eV, which is preferably accomplished by growing an aluminum indium phosphide epitaxial layer, e.g., $Al_{0.42}In_{0.58}P$.

Base layer 41 is grown on top of back layer 39, and emitter layer 42 is grown on top of base layer 41. The thickness of base layer 41 is from about 0.5 to about 0.8 µm, and the thickness of emitter layer 42 is from about 0.2 to about 0.4 µm. The active layer of top subcell 40, i.e., layers 41 and 42, are engineered to have an energy gap of 2.04 to 2.06 eV, and preferably 2.05 eV, which is preferably accomplished by growing an indium gallium aluminum phosphide epitaxial layer, e.g., $(In)_{0.6}(Ga_{0.33}Al_{0.67})_{0.4}P$. Base layer 41 is p-doped with zinc at a concentration of about 2.0 to about 4.0 E 17/cm$^3$, and emitter layer 42 is n-doped with silicon at a concentration of about 3.0 to about 6.0 E 18/cm$^3$.

Window layer 44 is grown on top of emitter layer 42 and has a thickness of about 0.03 to about 0.05 µm, and is n-doped with silicon at a concentration of about 0.8 to about 1.0 E 19/cm$^3$. Window layer 44 is engineered to have an energy gap of 2.2 to 2.4 eV, and preferably 2.3 eV, which is preferably accomplished by growing an aluminum indium phosphide epitaxial layer, e.g., $Al_{0.42}In_{0.58}P$.

Optional cap 46 is grown on top of top subcell 40 and has a thickness of about 0.1 to about 0.2 µm, is n-doped with silicon at a concentration of about 0.8 to about 1.0 E 19/cm$^3$, and has an energy gap of 1.2 eV, which is preferably accomplished by growing an epitaxial layer of indium gallium arsenide, e.g., $In_{0.13}Ga_{0.87}As$, that has the same composition as the bottom cell material.

In another embodiment, the multi-junction photovoltaic cells of this invention include four subcells, i.e., a quad-junction cell. The bottom or first cell in not necessarily lattice matched to the other subcells, but the other subcells are lattice matched to one another. A buffer layer is grown between the lower subcell and the lower-middle or second subcell.

The first subcell of this embodiment, which may also be referred to as the bottom subcell, is preferably engineered to have an energy gap of about 0.5 eV to about 0.7 eV, and more preferably 0.66 eV. This is preferably accomplished by employing a germanium wafer.

The second subcell of this embodiment, which may also be referred to as the bottom-middle subcell, is preferably engineered to have an energy gap of about 1.1 to about 1.4 eV in a similar fashion to the bottom subcell of the first embodiment, which is described above.

The third subcell of this embodiment, which may also be referred to as the top-middle subcell, is preferably engineered to have an energy gap of about 1.4 to about 1.8 eV in a similar fashion to the middle subcell of the first embodiment, which is described above.

The forth subcell of this embodiment, which may also be referred to as the top subcell, is preferably engineered to have an energy gap of about 1.9 to about 2.3 eV in a similar fashion to the top subcell of the first embodiment, which is described above.

Figure 2:
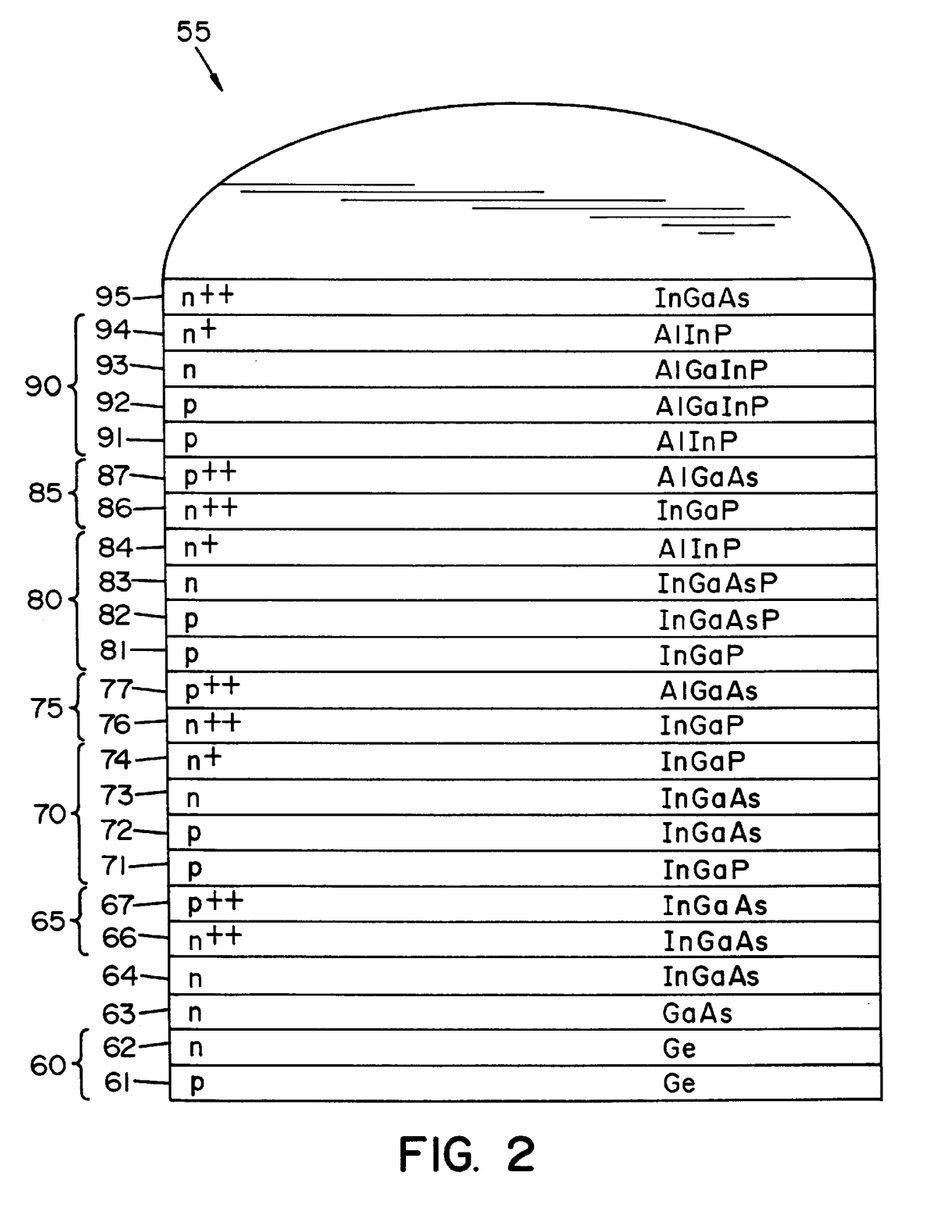
FIG. 2 is a sketch of a quad-junction solar cell according to one embodiment of this invention, although it is noted that the various layers of the cell are not drawn to scale, and as those skilled in the art will appreciate the cell is not completed inasmuch as the contacts and MESA isolation are not shown.

The preferred quad-junction solar cell can be described with reference to FIG. 2. Quad-junction cell 55 is constructed on substrate, which preferably includes a doped germanium (Ge) wafer 60. While the thickness of the wafer can be varied depending on the intended application requirements, a thickness of about 300 to about 400 µm is preferred. Preferably, the Ge wafer is p-doped.

The Ge wafer is modified to form a first subcell, which can also be referred to by the numeral 60, and which may also be referred to as the bottom subcell. This is accomplished by n-doping the upper surface 62 of the wafer. This can be accomplished by ion-implant techniques whereby n-dopant is forced into the upper layer 61 of wafer 60 or by diffusion techniques whereby the wafer is heated to about 550–650° within a MOVPE reactor and the dopant is then introduced into the reaction chamber. As a result, Ge wafer includes active layers including base layer 61, which is p-doped, and emitter layer 62, which is n-doped.

The thickness of base layer 61 is preferably from about 300 µm to about 400 µm, and the thickness of emitter layer 62 is from about 0.3 to about 0.6 µm, and more preferably about 0.5 µm. The active layers of bottom subcell 60, i.e., layers 61 and 62, which have an energy gap of 0.66 eV, which is a characteristic of a germanium wafer. Base layer 62 is preferably p-doped with zinc at a concentration of about 0.8 to about 1.2 E 18/cm$^3$, and emitter layer 63 is preferably n-doped with silicon at a concentration of about 1.8 to about 2.2 E 18/cm$^3$. The Ge wafer has a lattice constant of about 5.64 Å.

An upper window 63 is preferably grown on the top of the Ge wafer. This window preferably includes an epitaxial layer of GaAs, which has a lattice constant of 5.65 Å. The thickness of window layer 63 is preferably about 0.8 to about 1.2 µm, and it is preferably n-doped with silicon at a concentration of about 1.8 to about 2.2 E 18/cm$^3$.

Buffer layer 64 is preferably grown on top of window 63. Buffer 64 is characterized in a similar fashion to buffer layer 14 of the first embodiment except that buffer layer 64 is preferably n-doped with silicon at a concentration of about 1.8 to about 2.2 E 18/cm$^3$.

Tunnel junction 65 is preferably grown on top of buffer layer 64. Tunnel junction 65 includes a lower layer 66, which is degenerately n-doped with silicon at a concentration above about 1.0 E 19/cm$^3$, and a upper layer 67, which is degenerately p-doped with zinc at a concentration above about 1.0 E 19/cm$^3$. Lower level 66 is engineered to have an energy gap of 1.1 to 1.4 eV, and preferably 1.2 eV, which is preferably accomplished by growing an indium gallium phosphide epitaxial layer, e.g. $In_{0.13}Ga_{0.67}As$. Upper layer 67 is engineered to have an energy gap of 1.1 to 1.4 eV, and preferably 1.2 eV, which is preferably accomplished by growing an indium gallium arsenide epitaxial layer, e.g. $In_{0.13}Ga_{0.67}As$. Lower layer 66 has a thickness from about 0.02 to about 0.03 µm, and upper layer 67 has a thickness of about 0.02 to about 0.03 µm. While it is preferred that both upper layer 66 and lower layer 67 are lattice matched, these layers may be mismatched within about 10%, i.e., 0.1 Å, with respect to the subcells since both upper layer 66 and lower layer 67 are very thin. It is believed that subsequent subcells can be pseudomorphically grown on the mismatched tunnel junction.

Bottom-middle subcell 70 includes a back window 71, a base layer 72, and emitter layer 73, and a front window 74. Each layer of bottom-middle subcell 70 is characterized in a similar fashion to the bottom subcell 30 of the first embodiment.

Middle tunnel junction 75 includes lower layer 76 and upper layer 77. Lower layer 76 is characterized in a similar fashion to lower layer 27 of tunnel junction 26 of the first embodiment, and upper layer 77 is characterized in a similar fashion to upper layer 28 of tunnel junction 26 of the first embodiment.

Top-middle subcell 80 includes a back window 81, a base layer 82, an emitter layer 83, and a front window 84. Each layer of top-middle subcell 80 is characterized in a similar fashion to the middle subcell 30 of the first embodiment. Lower tunnel junction 75 includes lower layer 76 and upper layer 77. Each layer of tunnel junction 75 is characterized in a similar fashion to the first tunnel junction 26 of the first embodiment.

Upper tunnel junction 85 includes lower layer 86 and upper layer 87. Lower layer 86 is characterized in a similar fashion to lower layer 37 of tunnel junction 36 of the first embodiment, and upper layer 87 is characterized in a similar fashion to upper layer 38 of tunnel junction 36 of the first embodiment.

Top subcell 90 includes a back window 91, a base layer 92, an emitter layer 93, and a front window 94. Each layer of top subcell 90 is characterized in a similar fashion to the top cell 40 of the first embodiment. Upper tunnel junction 85 includes a lower layer 86 and an upper layer 87. Each layer of tunnel junction 85 is characterized in a similar fashion to second tunnel junction 36 of the first embodiment.

Quad-junction solar cell 55 may include a cap layer 95, which is characterized in a similar fashion to cap 46 of the first embodiment.

Although the preferred embodiment employs zinc as the p-dopant and silicon as the n-dopant, those skilled in the art appreciate that other dopants can be employed. For example, other p-dopants include carbon, cadmium, beryllium, or magnesium, and other n-dopants include sulfur, tellurium, selenium, germanium, or tin.

It should be understood that n- and p-type layers described in this invention are reversible, i.e., the sequence can begin with either type and a change to the other type can occur at a homo-junction or interface between the layers.

Standard photolithography can be used to define the area of the individual cells. Wet chemical etching, such as may be accomplished with phosphoric acid, can be employed to remove the epitaxial layers between each of the individual cells.

As is generally practiced in the art, contacts are constructed on the top and bottom surfaces of the solar cell.

In a preferred embodiment, the top contact includes a grid whereby the open surface that is not blocked by the grid is preferably greater than 90% of the surface area, more preferably greater than 94% of the surface area, and even more preferably about or greater than 96% of the surface area.

The grid is preferably is constructed by first depositing a thin layer, e.g., about 35 to about 45 Å, of chrome, and then depositing thicker layer, e.g., about 9,000 to about 11,000 Å, of gold on top of the chrome. The grid geometry of the front contacts can be made by using standard reverse imaging photolithography. The metals, e.g., chrome and gold, can then be deposited by standard E-beam vacuum deposition techniques The contact on the back or lower part of the solar cell, e.g., on the back of the GaAs wafer 12, preferably includes a gold-zinc alloy. This alloy is preferably formed by depositing a first layer of gold, a second layer of zinc, and a third layer of gold, and then annealing the three layers to form an alloy. The first layer that is deposited to the back of wafer 12 is a layer of gold having a thickness of about 30 to about 50 Å, the second or middle layer is a layer of zinc having a thickness of about 380 to about 420 Å, and the third or bottom layer is a layer of gold having a thickness of about 4500 to about 5500 Å. Once deposited, the layers are annealed at about 400° C. within a nitrogen atmosphere for about 4 to about 6 minutes.

As is typically practiced in the art, an anti-reflective coating is deposited on top of the contacts and cap layer. Any anti-reflective coating that is employed in the art may be used in practicing this invention. In one preferred embodiment, the anti-reflective coating includes three layers. The first or seed layer, which is about 50 to about 100 Å thick, comprises magnesium fluoride. The second layer, which has a thickness of about 950 to about 1,000 Å, comprises zinc sulfide. The third layer, which is also the top layer, and has a thickness of about 400 to about 450 Å comprises magnesium fluoride. The thickness of the various layers, as well as the number of layers, can be adjusted to provide anti-reflection properties over a wider band width. The preferred method for depositing the anti-reflective coating on the top of the cell is by thermal evaporation within a vacuum. Other techniques for depositing these materials may also be employed as is known in the art.

The growth of each crystal layer within the solar cell of the present invention can be grown by a variety of techniques including, but not limited to, metal organic vapor phase epitaxy (MOVPE), liquid phase epitaxy (LPE), molecular beam epitaxy (MBE), and chemical beam epitaxy (CBE). The preferred method employs a fast-switching, horizontal, low-pressure MOVPE reactor.

The preferred method for growing the preferred embodiment of the present invention employs MOVPE at a growth temperature of from about 600° C. to about 650° C., and pressure of about 100 to about 150 torr, except that the preferred growth temperature is from about 680° C. to about 700° C. where aluminum indium phosphide crystal is grown. The rate of crystal growth is preferably from about 2 to about 5 $\mu$m/hr.

As noted above, the photovoltaic cells of this invention are particularly useful for non-terrestrial applications. Namely, the cells of this invention can be included within a solar array of cells on a satellite wing. Other non-terrestrial devices that can make use of the solar cells of this invention include other interplanetary devices and space stations. The cells of this invention can also be used in terrestrial applications in lieu of silicon-based cells.

In order to demonstrate the practice of the present invention, the following examples have been prepared and tested. The examples should not, however, be viewed as limiting the scope of the invention. The claims will serve to define the invention.

GENERAL EXPERIMENTATION

A triple-junction monolithic solar cell was constructed to include an indium gallium arsenide (InGaAs) bottom subcell, an indium gallium arsenide phosphide (InGaAsP) middle subcell, and an indium gallium aluminum phosphide (InGaAlP) top subcell. The subcells were grown by using a fast-switching, horizontal, low-pressure metal organic vapor phase epitaxy (MOVPE) reactor. The growth temperature and pressure for each layer was 620° C. and 150 torr, except that aluminum indium phosphide (AlInP) required a growth temperature of 680° C. The growth rate ranged from 1.5 to 2.3 $\mu$m/hr. The respective lattices were grown by employing trimethylindium, triethylgallium, diethylzinc, arsene ($AsH_3$), phosphene ($PH_3$), and silane ($SiH_4$). Hydrogen carrier gas was used to inject the precursors into the reaction chamber.

The first step in constructing this cell involved growing a 0.2 $\mu$m layer of GaAs on a 350 $\mu$m GaAs wafer that was p-doped with zinc. The GaAs epitaxial layer was doped with zinc at a concentration of about 2 E 18/cm$^3$. The wafer was doped with zinc at a concentration of about 8 E 18/cm$^3$. By growing additional GaAs layer on the wafer, a clean surface was provided for growth of the buffer. Accordingly, on the GaAs lattice, a buffer indium gallium arsenide ($In_{0.13}Ga_{0.87}As$) was deposited. This buffer layer had a thickness of 1.0 $\mu$m and was doped with zinc at a concentration of 2 E 18/cm$^3$.

An $In_{0.62}GaP$ back window layer was deposited on the InGaAs buffer layer. This window layer had a thickness of 0.05 μm and was doped with zinc at a concentration of 5 E 17/cm³.

The bottom subcell was grown on the window layer. The base layer of this first subcell comprised $In_{0.13}Ga_{0.87}As$ and was doped with zinc at a concentration of 2 E 17/cm³ and was 3.0 μm thick. An emitter layer of $In_{0.13}Ga_{0.87}As$ having a thickness of 0.5 μm and doped with silicon at a concentration of 5 E 18/cm³, was grown on the base layer.

On top of the first subcell, a window layer having a thickness of 0.05 μm was grown. This window comprised $In_{0.62}GaP$ and was doped with silicon a concentration of 8 E 18/cm³.

A first tunnel junction was grown on the first subcell. The first layer of the tunnel junction, which had a thickness of about 0.025 μm comprised $In_{0.62}Ga_{0.38}P$ and was degenerately doped with zinc at a concentration in excess of 2 E 19/cm³. The second layer of the tunnel junction was grown to a thickness of about 0.025 μm, comprised $Al_{0.09}Ga_{0.91}As$, and was doped with zinc at a concentration of about 8 E 18/cm³.

The back window layer of the middle cell was grown on top of the first tunnel junction. This layer had a thickness of 0.05 μm, comprised $In_{0.62}GaP$, and was doped with zinc at a concentration of 5 E 17/cm³. A second subcell was grown on the second back window layer. This subcell included a base layer having a thickness of 0.8 μm, comprised $In_{0.49}Ga_{0.51}As_{0.23}P_{0.77}$, and was doped with zinc at a concentration of 3 E 17/cm³. An emitter layer having a thickness of 0.4 μm was grown on top of the base layer. This emitter layer included $In_{0.49}Ga_{0.51}As_{0.23}P_{0.77}$, and was doped with silicon at a concentration of 9 E 18/cm³.

A top window layer was grown on the middle emitter layer. This window had a thickness of 0.04 μm, and included $Al_{0.42}InP$ that was doped with silicon at a concentration of 1 E 19/cm³.

A second tunnel junction was grown on top of the window layer. The second tunnel junction included a first layer having a thickness of 0.025 μm, and included $In_{0.62}Ga_{0.38}P$ degenerately doped with silicon at a concentration in excess of 2 E 19/cm³. The second layer of the tunnel junction was grown to a thickness of 0.025 μm and included $Al_{0.09}Ga_{0.91}As$ doped with zinc at a concentration of 8 E 18/cm³.

The back window of the top cell was grown on top of the second tunnel junction to a thickness of about 0.04 μm. This window layer included $Al_{0.42}In_{0.58}P$ doped with zinc at a concentration of 8 E 18/cm³.

The base layer of the top cell was grown on the window layer. The base layer was grown to a thickness of 0.6 μm and included $(In)_{0.6}(Ga_{0.33}Al_{0.67})_{0.4}P$ that was zinc doped at a concentration of about 3 E 17/cm³. The emitter layer of this third or top subcell had a thickness of about 0.2 μm and included $(In)_{0.6}(Ga_{0.33}Al_{0.67})_{0.4}P$ that was silicon doped at a concentration of 5 E 18/cm³. The top window layer of the top subcell was grown on top of the emitter layer to a thickness of about 0.04 μm. This window included $Al_{0.42}In_{0.58}P$ doped with silicon at a concentration of 1 E 19/cm³. A cap layer of $In_{0.13}Ga_{0.87}As$ having a thickness of about 0.1 μm and doped with silicon at a concentration of 1 E 19/cm³ was grown on top of the window layer.

The wafer, which has now been modified with the epitaxial layers, was then modified by positive photolithography to divide the surface into individual cells. Low-resistance ohmic back contacts were prepared by depositing a first layer of gold (about 40 Å), a second layer or middle layer of zinc (about 400 Å), and a third or bottom layer of gold (about 5000 Å). These metals were deposited by using standard thermal evaporation deposition techniques within a vacuum. The deposited layers of gold, zinc, and gold, were then annealed at 400° C. for about five minutes.

A front contact was prepared by standard reverse imaging photolithography. By employing this technique, a grid geometry was constructed for the front contact. The grid geometry included a first layer of chrome (about 40 Å) deposited on the cap layer and a second layer of gold (about 10,000 Å) deposited on the chrome. These metals were E-bean deposited on the top surface of the solar cell.

An anti-reflective coating comprising a three-layer film was deposited by thermal evaporation within a vacuum. The first or seed layer included magnesium fluoride at a thickness of about 75 Å, the second layer included zinc sulfide at a thickness of about 436 Å, and the third layer included magnesium fluoride at a thickness of about 997 Å. Once deposited, the layers were annealed at 400° C. for about 5 minutes to form an alloy.

While the best mode and preferred embodiment of the invention have been set forth in accord with the Patent Statues, the scope of this invention is not limited thereto, but rather is defined by the attached claims. Thus, the scope of the invention includes all modifications and variations that may fall within the scope of the claims.

What is claimed is:

1. A triple-junction photovoltaic device comprising:

a p-doped substrate comprising GaAs;

a p-doped buffer layer deposited on said substrate, where said buffer layer comprises $In_{0.13}Ga_{0.87}As$;

a bottom subcell deposited on said buffer layer, where said bottom subcell includes a p-doped back window layer comprising $In_{0.62}Ga_{0.38}P$, a p-doped base layer deposited on said back window layer and comprising $In_{0.13}Ga_{0.87}As$, an n-doped emitter layer deposited on said base layer and comprising $In_{0.13}Ga_{0.87}As$, and an n-doped front window layer comprising $In_{0.62}Ga_{0.38}P$;

a lower tunnel junction deposited on said bottom subcell, where said lower tunnel junction includes an n-doped lower layer comprising $In_{0.62}Ga_{0.38}P$, and a p-doped upper layer comprising $Al_{0.09}Ga_{0.91}As$;

a middle subcell deposited on the upper surface of said lower tunnel junction, where said middle subcell includes a p-doped back window layer comprising $In_{0.62}Ga_{0.38}P$, a p-doped base layer deposited on said back window layer and comprising $In_{0.49}Ga_{0.51}As_{0.23}P_{0.77}$, an n-doped emitter layer deposited on said base layer and comprising $In_{0.49}Ga_{0.51}As_{0.23}P_{0.77}$, and an n-doped front window layer comprising $Al_{0.42}In_{0.58}P$;

an upper tunnel junction deposited on said middle subcell, where said upper tunnel junction includes an n-doped lower layer comprising $In_{0.62}Ga_{0.38}P$, and a p-doped upper layer comprising $Al_{0.09}Ga_{0.91}As$;

a top subcell deposited on the upper surface of said upper tunnel junction, where said top subcell includes a p-doped back window layer comprising $Al_{0.42}In_{0.58}P$, a p-doped base layer deposited on said back window layer and comprising $(In)_{0.6}(Ga_{0.33}Al_{0.67})_{0.4}P$, an n-doped emitter layer deposited on said base layer and comprising $(In)_{0.6}(Ga_{0.33}Al_{0.67})_{0.4}P$, and an n-doped front window layer comprising $Al_{0.42}In_{0.58}P$; and an n-doped cap layer deposited on said top subcell and comprising $In_{0.13}Ga_{0.87}As$.

2. The device of claim 1, where said buffer layer has a thickness from about 1.0 to about 2.0 μm.

3. The device of claim 1, where said back window layer of said bottom subcell has a thickness of about 0.03 to about 0.06 μm, where said base layer of said bottom subcell has a thickness of about 2.5 to about 3.5 μm, where said emitter layer of said bottom subcell has a thickness of from about 0.4 to about 0.6 μm, and where said front window layer of said bottom subcell has a thickness of about 0.03 to about 0.06 μm.

4. The device of claim 3, where said back window layer of said middle subcell has a thickness of about 0.03 to about 0.06 μm, where said base layer of said middle subcell has a thickness of about 0.4 to about 1.0 μm, where said emitter layer of said middle subcell has a thickness of from about 0.3 to about 0.6 μm, and where said front window layer of said middle subcell has a thickness of about 0.03 to about 0.05 μm.

5. The device of claim 4, where said back window layer of said top subcell has a thickness of about 0.03 to about 0.05 μm, where said base layer of said top subcell has a thickness of about 0.5 to about 0.8 μm, where said emitter layer of said top subcell has a thickness of from about 0.2 to about 0.4 μm, and where said front window layer of said top subcell has a thickness of about 0.03 to about 0.05 μm.

6. The device of claim 5, where said lower layer of said lower tunnel junction has a thickness of about 0.02 to about 0.03 μm, and where said upper layer of said lower tunnel junction has a thickness of about 0.02 to about 0.03 μm.

7. The device of claim 6, where said lower layer of said upper tunnel junction has a thickness of about 0.02 to about 0.03 μm, and where said upper layer of said upper tunnel junction has a thickness of about 0.02 to about 0.03 μm.

8. A solar cell comprising:
a substrate:
a buffer layer on said substrate;
first subcell on said buffer layer, where the first subcell includes a doped first base layer and a first emitter layer that is oppositely doped from the first base layer, and where the subcell comprises InGaAs;
a second subcell, where the second subcell includes a doped second base layer and a second emitter layer that is oppositely doped from the second base layer, and where the second subcell comprises InGaAsP; and
a third subcell, where the third subcell includes a doped third base layer and a third emitter layer that is oppositely doped from the third base layer, and where the third subcell comprises AlGaInP, where said first subcell, said second subcell, and said third subcell are lattice matched, and where said substrate is lattice mismatched with said first, second, and third subcells.

9. The cell of claim 8, where the cell further includes first and second tunnel junction layers, where the first tunnel junction layer includes a degenerately doped lower layer comprising InGaP and an upper layer comprising AlGaAs that is oppositely degenerately doped from the lower layer, and where the second tunnel junction includes a degenerately doped second lower layer comprising InGaP and a second upper layer comprising AlGaAs that is oppositely degenerately doped from the second lower layer.

10. The cell of claim 8, where said first base layer and said first emitter layer comprise $In_{0.13}Ga_{0.87}As$.

11. The cell of claim 8, where said second base layer and said second emitter layer comprise $In_{0.49}Ga_{0.51}As_{0.23}P_{0.77}$.

12. The cell of claim 8, where said third base layer and said third emitter layer comprise $In_{0.6}(Ga_{0.33}Al_{0.67})_{0.4}P$.

13. The solar cell of claim 8, further comprising a first tunnel junction between said first subcell and said second subcell, and a second tunnel junction between said second subcell and said third subcell.

14. A multi-junction photovoltaic device comprising:
a bottom subcell, where said bottom subcell includes a p-doped base layer comprising germanium, and an n-doped emitter layer comprising germanium;
a bottom window layer deposited on said bottom subcell, where said bottom window layer comprises GaAs;
a p-doped buffer layer deposited on said bottom window layer, where said buffer layer comprises $In_{0.13}Ga_{0.87}As$;
a lower tunnel junction deposited on said buffer layer, where said lower tunnel junction includes a degenerately n-doped lower layer comprising $In_{0.13}Ga_{0.87}As$, and a degenerately p-doped upper layer comprising $In_{0.13}Ga_{0.87}As$;
a lower-middle subcell deposited on the upper surface of said lower tunnel junction, where said lower-middle subcell includes a p-doped back window layer comprising $In_{0.62}Ga_{0.38}P$, a p-doped base layer deposited on said back window layer and comprising $In_{0.13}Ga_{0.87}As$, an n-doped emitter layer deposited on said base layer and comprising $In_{0.13}Ga_{0.87}As$, and an n-doped front window layer comprising $In_{0.62}Ga_{0.38}P$;
a middle tunnel junction deposited on said lower-middle subcell, where said middle tunnel junction includes an n-doped lower layer comprising $In_{0.62}Ga_{0.38}P$, and a p-doped upper layer comprising $Al_{0.09}Ga_{0.91}As$;
an upper-middle subcell deposited on the middle tunnel junction, where said upper-middle subcell includes a p-doped back window layer comprising $In_{0.62}Ga_{0.38}P$, a p-doped base layer deposited on said back window layer and comprising $In_{0.49}Ga_{0.51}As_{0.23}P_{0.77}$, an n-doped emitter layer deposited on said base layer and comprising $In_{0.49}Ga_{0.51}As_{0.23}P_{0.77}$, and an n-doped front window layer comprising $Al_{0.42}In_{0.58}P$;
an upper tunnel junction deposited on said upper-middle subcell, where said upper tunnel junction includes an n-doped lower layer comprising $In_{0.62}Ga_{0.38}P$, and a p-doped upper layer comprising $Al_{0.09}Ga_{0.91}As$;
a top subcell deposited on the upper tunnel junction, where said top subcell includes a p-doped back window layer comprising $Al_{0.42}In_{0.58}P$, a p-doped base layer deposited on said back window layer and comprising $(In)_{0.6}(Ga_{0.33}Al_{0.7})_{0.4}P$, an n-doped emitter layer deposited on said base layer and comprising $(In)_{0.6}(Ga_{0.33}Al_{0.67})_{0.4}P$, and an n-doped front window layer comprising $Al_{0.42}In_{0.58}P$; and
an n-doped cap layer deposited on the top subcell and comprising $In_{0.13}Ga_{0.87}As$.

15. A photovoltaic device comprising:
a GaAs substrate, which has a lattice constant of 5.65 Å;
a buffer layer on said substrate;
at least three subcells sequentially grown on said buffer layer, where said at least three subcells are lattice matched at a lattice constant of 5.67 Å to 5.73 Å, and where said at least three subcells include a first subcell that is engineered to have an energy gap of 1.2 to about 1.3 eV, a second subcell that is engineered to have an energy gap of 1.4 to 1.8 eV, and a third subcell that is engineered to have an energy gap of 1.9 to 2.3 eV.

16. The photovoltaic device of claim 15, where said first subcell comprises indium gallium arsenide, where said second subcell comprises indium gallium arsenide phosphide, and said third subcell comprises indium gallium aluminum phosphide.

17. The photovoltaic device of claim 15, where said first subcell, said second subcell, and said third subcell each include a base layer and an emitter layer.

18. The photovoltaic device of claim 17, where said first subcell, said second subcell, and said third subcell each include a front and back window, and where said base layer, said emitter layer, said front window, and said back window are lattice matched to one another.

19. The photovoltaic device of claim 18, where said base layer and said emitter layer are oppositely doped.

20. The photovoltaic device of claim 15, further comprising a GaAs epitaxial layer on said substrate.

21. The photovoltaic device of claim 19, where said at least three subcells are lattice matched at a lattice constant of 5.70 Å to 5.73 Å.

22. The photovoltaic device of claim 21, where said buffer layer is graded.

23. The photovoltaic device of claim 24, where said buffer comprises a top layer, a bottom layer, and a plurality of layers therebetween, where each layer comprises indium gallium arsenide, and where the indium concentration in each layer is increased from the bottom to the top layer to achieve said graded buffer.

* * * * *